United States Patent [19]

Pulker et al.

[11] 4,333,962
[45] Jun. 8, 1982

[54] METHOD FOR PRODUCING GOLD COLOR COATINGS

[75] Inventors: Hans K. Pulker, Triesen, Liechtenstein; Helmut Daxinger, Wangs, Switzerland

[73] Assignee: Balzers Aktiengesellschaft, Liechtenstein

[21] Appl. No.: 182,800

[22] Filed: Aug. 29, 1980

[30] Foreign Application Priority Data

Sep. 4, 1979 [CH] Switzerland .......................... 7971/79

[51] Int. Cl.³ ............................................ C23C 11/14
[52] U.S. Cl. ...................................... 427/37; 204/177
[58] Field of Search ..................... 427/38, 39, 36, 37; 204/164, 177

[56] References Cited

U.S. PATENT DOCUMENTS

| | | | |
|---|---|---|---|
| 3,900,592 | 8/1975 | Kennedy et al. | 427/39 |
| 3,953,619 | 4/1976 | Matsubara | 427/39 |
| 4,226,082 | 10/1980 | Nishida | 427/38 |
| 4,254,159 | 3/1981 | Pulker et al. | 427/38 |

FOREIGN PATENT DOCUMENTS 2410483  9/1974  Fed. Rep. of Germany ........ 427/39

Primary Examiner—John H. Newsome
Attorney, Agent, or Firm—McGlew and Tuttle

[57] ABSTRACT

A method of controlling color hues of coatings particularly gold color coatings on substrate using a housing capable of being evacuated, and having an evacuated chamber, a hot cathode chamber in communication with the evacuated chamber and a support structure for the substrate to be coated and a crucible for the material to be evaporated acting as an anode and with a hot cathode in the hot cathode chamber, comprises evaporating the material in the evaporation chamber while maintaining a residual gas atmosphere containing nitrogen therein, producing an electric gas arc discharge between the cathode and the anode of a low voltage, and mixing a carbon containing gaseous compound to the residual gas while applying a negative biasing voltage relative to the housing to the substrate to be coated.

11 Claims, 1 Drawing Figure

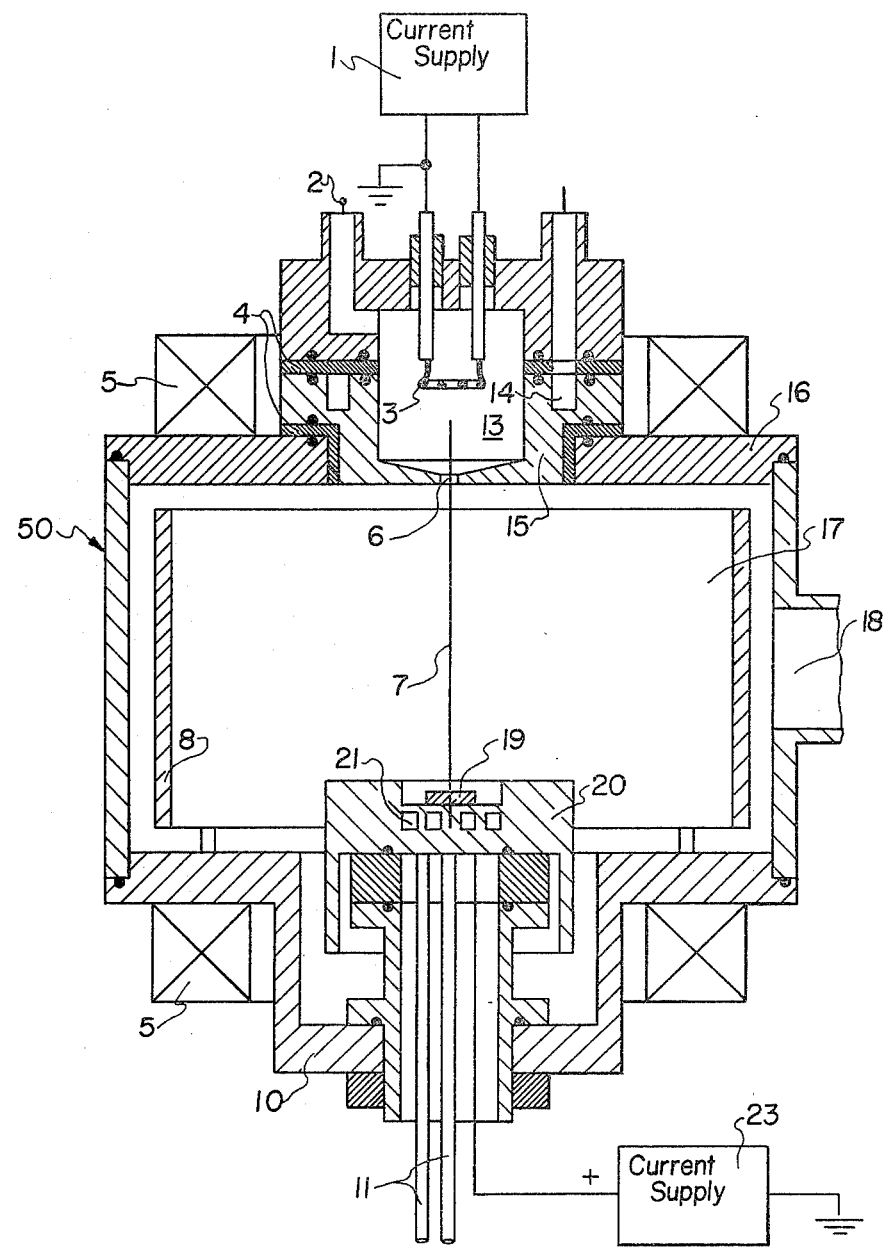

METHOD FOR PRODUCING GOLD COLOR COATINGS

FIELD AND BACKGROUND OF THE INVENTION

This invention relates in general to methods for coating materials and in particular to a new and useful method.

It is known to produce such coatings by a reactive, ion supported evaporation in vacuum, and particularly a so-called low voltage arc discharge has proved suitable for the evaporation, if too strong a heating of the substrates is to be prevented. That is, because of the strong activation of the reactants in the low voltage arc, a satisfactory reaction is obtained even on cooled substrates, which is not easy with other reactive deposition process. One difficulty still arises, however, namely in the color of the coatings. The present invention is directed to a method of producing gold-color coatings on substrates, which can be reproduced with great accuracy in constant and uniform color hues. This uniformity is particularly important in the series manufacture of gold-color parts which are to be interchangeable within close tolerances. A more particular objective is to produce coatings in golden hues which are standard in the watch making industry, and to achieve a smaller reject rate and thus a better economy as compared to prior art methods. At the same time the novel method should assure a particularly careful treatment of the substrates during the coating operation, to be able to also treat substrates which, because of their sensitivity to heat, cannot be coated in conventional ways, for example in the chemical vapor deposition process (CVD); (this more particularly includes hard-chromium plating where the hardness is lost at temperatures above 400° C. Alloys such as brass, and some plastics also are thermally sensitive substrates).

Deposition of gold-color layers of mere titanium nitride by reactive evaporation, with a simultaneous activation of the residual gas by means of an electric gas discharge has been proposed by applicant already in an earlier application, and the layers obtainable with this older method already represented a substantial advance in obtaining desired hues. The present invention is intended as a further step in this direction.

SUMMARY OF THE INVENTION

The invention comprises a method of producing gold-color coatings by vacuum evaporation of titanium, zirconium, or hafnium, or alloys composed of these metals in any combination, in a residual gas atmosphere containing nitrogen and argon and while activating the residual gas by an electric discharge. The residual gas is activated with an electric gas discharge established between a hot cathode and an anode.

The inventive method has the following features:

(a) the gas discharge is a low voltage arc discharge between a hot cathode and an anode;

(b) a carbon containing gaseous compound is, in addition, admitted with the residual gas; and (c) a bias voltage which is negative relative to the housing is applied to the substrate to be coated.

A further object of the invention is to provide a method of controlling color hues of coatings on substrates using a housing capable of being evacuated and having an evaporator chamber, a hot cathode chamber in communication with the evaporation chamber and a support structure for the substrate to be coated and a crucible for the material to be evaporated spaced from the support structure and forming an anode along with a hot cathode in the hot cathode chamber comprising evaporating the material in the evaporation chamber while maintaining a residual gas atmosphere containing nitrogen therein, producing an electric gas arc discharge between the cathode and the anode of a relatively low voltage, admixing a carbon containing gaseous compound with the residual gas, and applying a biasing voltage relative to the housing to the substrate to be coated.

A further object of the invention is to provide a method of controlling color hues of golden colored coatings, which is simple in design, rugged in construction and economical to manufacture.

The various features of novelty which characterize the invention are pointed out with particularity in the claims annexed to and forming a part of this diclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE FIGURE

The FIGURE is a sectional view of a device which can be used to carry out the method for controlling the color hues applied to a substrate by evaporation, in accordance with the invention.

DETAILED DESCRIPTION OF THE PREFERRED EMBODIMENTS

Referring to the drawing in particular, a device for carrying out the inventive method comprises a housing generally designated 50 which includes a hot cathode chamber 13 therein which communicates through an aperture 6 with an evaporation chamber 17 having a support 8 therein which carries a material thereon to be coated. The material to be evaporated 19 is arranged in a crucible 20 aligned with the aperture 6 and the hot cathode chamber 13. A current supply 1 is effective to current to a hot chathode 3. A current supply 23 is employed to control the supply of current and voltage to the crucible 20.

The vacuum or evaporation chamber 17 has an exhaust connection 18. Chamber 13 accommodates the hot cathode 3 which is supplied with current from the source 1. At the bottom of the evaporation chamber 17, the crucible 20 for the evaporative material 19 is provided and can be cooled through coolant supply and discharge conduits 11, and coolant channels 21. The supporting structure 8 is in the form of a hollow cylinder for receiving the substrates to be coated. Hot cathode chamber 13 is connected to a gas supply inlet 2, and to a coolant channel 14 serving the purpose of cooling the partition 15 between the hot cathode chamber 13 and the evaporation chamber 17. To produce in the evaporation chamber a magnetic field substantially parallel to the axis 7 of the discharge, field coils 5 are provided outside a housing bottom part 10 and a housing top part 16 of the evaporation chamber. The substrates to be coated, for example, watch cases, are secured to the side of the supporting structure 8 facing the evaporative source 19.

In order to produce gold-color layers, according to a preferred form of the inventive method, titanium metal in lumps was placed in crucible 20. The apparatus was then evacuated to $10^{-5}$ millibar and a gas mixture containing nitrogen, acetylene, and argon was introduced through inlet 2 another inlet (not shown). Gas entering inlet 2 then passed to hot cathode chamber 13, and aperture 6, into evaporation chamber 17, and the gas mixture was pumped out therefrom through exhaust connection 18 continuously at such a rate as to maintain a pressure of $5 \times 10^{-2}$ millibar in the evaporation chamber. To preserve the hot cathode 3, only argon may be introduced into hot cathode chamber 13, and the nitrogen and carbon containing gases may be introduced into the evaporation chamber 17 through a separate inlet so that during the evaporation, predominantly the required reactive residual gas atmosphere in mixture with argon is present in the evaporation chamber, whose pressure can be adjusted to an optimal value by continuous pumping off. The hot cathode 3 to which a ground potential was applied, was heated with 1.5 killowatt and then a positive voltage of +70 volt from supply 23 was applied to the crucible 20 as shown in the drawing and −50 volts as a bias voltage was applied to the substrates. By shortly applying the positive voltage to the partition 15 as well, thus separating evaporation chamber 17 from hot cathode chamber 13 electrically, the low voltage arc was struck. The above and all the following indications of voltage are relative to the ground potential which was applied to the chamber wall. A current of 100 A flowing through the hot cathode was obtained. The current flowing through the anode (crucible) was 120 A. The difference of 20 A between these two currents corresponds to the current flowing through the substrates. By the current flowing to crucible 20, thus to the anode, the titanium received therein was melted and evaporated at a rate of about 0.4 grams per minute. Under the effect of the residual gas strongly ionized by the low voltage arc discharge, a hard, extremely well adhering layer of golden yellow color has been obtained on substrates secured to support 8. In several tests, such a titanium evaporation rate was adjusted in each instance in order to produce on a test glass a deposit of 0.33 micrometers per minute in thickness. The negative substrate voltage was throughout 50 volts and the following color hues were obtained (the hues are indicated in accordance with Swiss standards of the watch making industry NIHS-03-50):

N), the atomic number proportion of N to C is $P_{N_2}$ to $P_{C_2H_2} = 3 \times 10^{-4}$ millibars to $1.2 \times 10^{-4}$ millibars = 2.5 (since the partial pressures of gases are proportional to the number of molecules in a given volume). The above data are not to be taken as values to the absolutely observed, but as values at which optimum results were obtained with the employed evaporator. Depending on the apparatus, the optimum values may vary by up to ±25%. To obtain a surface with the desired color hue, it mostly suffices to produce only the uppermost partial layers of the coating exactly in the respective color, i.e. with the indicated partial pressures, while the subjacent partial layers closer to the substrates may be deposited under conditions departing therefrom. It may be advisable, for example, first to provide a larger potential difference between the anode and the substrates, in order to obtain a higher energy of the particles impinging on the substrate surface and thus a better anchoring and stronger adhesion, and then, during the deposition of further partial layers of the coating, to gradually reduce the potential difference at least to the so-called sputtering threshold of the substrate and/or of the walls of the container. By sputtering threshold, the potential difference is understood above which the substrate, or the material of which the container walls are made, may be atomized. It should be noted that a higher potential difference has the effect of deepening the color.

During the inventive coating process it was possible to keep the temperature of the substrates permanently below 400° C., frequently even at a substantially lower level. High-gloss coatings were obtained, provided that the substrate surfaces were polished in advance and no finishing was necessary. The Vickers hardness of all coatings exceeded 2,000 kilograms per square millimeter square.

Since during the reactive vapor deposition the reacting residual gas components are spent, the gas must continually be resupplied to keep the respective partial pressures constant. The hot cathode chamber also must continually be supplied with gas in an amount sufficient to maintain therein the mean free length of path of the gas molecules, at the same order of magnitude as the spacing of hot cathode 3 from partition 15. Recommendable are arc (anode) voltages below 200 volts, but with currents of 30 A at least. It is further advisable to electrically insulate the partition 15 in which the aper-

| (1) | (jaune-pale 1N-14) with $P_{N_2}$ | = $2 \times 10^{-4}$ mbar/$P_{C_2H_2}$ | = $3 \times 10^{-5}$ mb |
|---|---|---|---|
| (2) | (jaune-pale 2N-18) with $P_{N_2}$ | = $2 \times 10^{-4}$ mbar/$P_{C_2H_2}$ | = $5 \times 10^{-5}$ mb |
| (3) | (jaune 3N) with $P_{N_2}$ | = $3 \times 10^{-4}$ mbar/$P_{C_2H_2}$ | = $1.2 \times 10^{-4}$ mb |
| (4) | (rose 4N) with $P_{N_2}$ | = $4 \times 10^{-4}$ mbar/$P_{C_2H_2}$ | = $3 \times 10^{-4}$ mb |
| (5) | (rouge 5N) with $P_{N_2}$ | = $4 \times 10^{-4}$ mbar/$P_{C_2H_2}$ | = $4 \times 10^{-4}$ mb |

In the above tests, the chemically very similar zirconium or hafnium may be used instead of titanium as well. As may be learned from the examples, the hue may be varied by appropriately adjusting the partial pressure of $N_2$ and $C_2H_2$. Aside from the acetylene as above, methane, ethylene and ethane are also suitable carbon containing compounds for the inventive method. Concerning the partial pressures to be used in the process, it must be kept in mind that the methane molecule contains a single carbon atom, while the other mentioned compounds contain two of them. Expressed in atomic number proportions, the residual gas atmosphere should contain nitrogen and carbon in a proportion ranging from one to one, to seven to one, as was provided in the above test. In test 3 for example, (hue 3 ture 6 connecting the hot cathode chamber and the evaporation chamber is provided using insulation 4, for example, and to keep it at a floating potential during the inventive process. The evaporation crucible must be kept at a positive potential with regard to the cathode. Departing from the example illustrated, an operation with both cathode and the evaporative material at a positive potential relative to the ground is also possible. The substrates to be coated are then always kept at a negative potential relative to the anode. They may in addition temporarily (in particular intermittently) be connected as the cathode of a self-sustained gas discharge.

Carbon-containing gas compounds which may be used include acetylene, ethylene, benzene and carbon monoxide. Oxygen may also be added to the carbon-containing compound with an atomic number proportion of oxygen to carbon ranging between 1.5 and 2.5.

While specific embodiments of the invention have been shown and described in detail to illustrate the application of the principles of the invention, it will be understood that the invention may be embodied otherwise without departing from such principles.

What is claimed is:

1. A method of controlling color hues of coatings on substrates using a housing capable of being evacuated and having an evaporation chamber therein, a hot cathode chamber therein in communication with the evaporation chamber, a support structure for the substance to be coated in said housing evaporation chamber and a crucible for material to be evaporated spaced from said support structure in said evaporation chamber and forming an anode, and a hot cathode in the hot cathode chamber, the method comprising evaporating the material in the evaporation chamber while maintaining a residual gas atmosphere containing nitrogen therein, producing an electric gas arc discharge between the cathode and anode of a low voltage, admixing a carbon containing gaseous compound to the residual gas, and applying a negative biasing voltage relative to the housing to the substrate to be coated.

2. A method according to claim 1, wherein the cathode and anode voltages are controlled so as to control a potential difference therebetween and a higher potential difference is effected to produce a deepening of the color of the coating on the substrate.

3. A method of producing gold-color coatings on substrates by evaporating in vacuum metals of the fourth group of the periodic table in a residual gas atmosphere in a housing containing nitrogen while simultaneously activating the residual gas with an electric gas discharge, characterized by a combination of the following features:
 (a) the gas discharge is a low voltage arc discharge between a hot cathode and an anode;
 (b) a carbon containing gaseous compound is in addition admixed to the residual gas; and
 (c) a bias voltage negative relative to the housing is applied to the substrates to be coated.

4. A method according to claim 3 or 1, wherein ethylene is used as a carbon containing compound.

5. A method according to claim 3 or 1, characterized in that acetylene is used as the carbon containing compound.

6. A method according to claim 3 or 1, characterized in that benzene is used as the carbon containing compound.

7. A method according to claim 3 or 1, characterized in that an oxygen and carbon containing compound in which the atomic number proportion of oxygen to carbon ranges between 1.5 and 2.5 is used as the carbon containing compound.

8. A method according to claim 3 or 1, characterized in that carbon dioxide is used as the carbon containing compound.

9. A method according to claim 3 or 1, characterized in that titanium is used as the metal and carbon dioxide is used as the carbon containing compound.

10. A method according to claim 3 or 1, characterized in that argon having a partial pressure between $5 \times 10^{-4}$ and $3 \times 10^{-3}$ millibar is admitted to the reaction gas.

11. A method according to claim 3 or 1, characterized in that nitrogen and carbon are contained in the reactive gas atmosphere in an atomic number proportion of one to one, to seven to one.

* * * * *